United States Patent [19]
Hwang et al.

[11] Patent Number: 6,041,994
[45] Date of Patent: Mar. 28, 2000

[54] RAPID AND SELECTIVE HEATING METHOD IN INTEGRATED CIRCUIT PACKAGE ASSEMBLY BY MEANS OF TUNGSTEN HALOGEN LIGHT SOURCE

[75] Inventors: Ming Hwang, Richardson; Gonzalo Amador, Dallas, both of Tex.; Lobo Wang, Taipei, Taiwan

[73] Assignee: Texas Instruments Incorporated, Dallas, Tex.

[21] Appl. No.: 08/991,751

[22] Filed: Dec. 16, 1997

Related U.S. Application Data

[63] Continuation-in-part of application No. 08/255,197, Jun. 7, 1994
[60] Provisional application No. 60/033,402, Dec. 18, 1996.

[51] Int. Cl.⁷ .......................... B23K 37/00; B23K 31/02; H05B 1/00; H05B 3/10
[52] U.S. Cl. .................... 228/4.5; 228/180.5; 228/234.1; 219/220; 219/553
[58] Field of Search ................................ 228/110.1–112, 228/4.5, 180.5; 219/56.01, 121.66, 129, 553, 220

[56] References Cited

U.S. PATENT DOCUMENTS

| | | | |
|---|---|---|---|
| 4,030,603 | 6/1977 | Angell | 206/583 |
| 4,278,861 | 7/1981 | Tan | 219/121 LD |
| 4,278,867 | 7/1981 | Tan | 219/121.64 |
| 5,049,718 | 9/1991 | Spletter et al. | 219/121.64 |
| 5,302,230 | 4/1994 | Ino et al. | 117/92 |
| 5,305,944 | 4/1994 | Yoshida et al. | 228/180.22 |
| 5,626,280 | 5/1997 | Ciambrone | 228/180.21 |
| 5,648,005 | 7/1997 | Cobb et al. | 219/411 |
| 5,783,025 | 6/1998 | Hwang et al. | 156/359 |
| 5,846,476 | 12/1998 | Hwang et al. | 264/493 |

OTHER PUBLICATIONS

"Industrial Applications of Lasers", Ready. 1978.

*Primary Examiner*—Patrick Ryan
*Assistant Examiner*—Kiley Stoner
*Attorney, Agent, or Firm*—Wade James Brady, III; Frederick J. Telecky, Jr.

[57] ABSTRACT

A method and apparatus for selectively heating a structure (20) capable of absorbing heat radiations in the 0.5 to 2 micron range relative to an adjacent structure (24) wherein a first structure capable of absorbing heat radiations in the 0.5 to 2 micron range is disposed adjacent a second structure much less capable of absorbing heat radiations in the 0.5 to 2 micron range. An unfocused heat source (28) which provides a major portion of its heat energy in the range of from about $0.5\mu$ to about $2\mu$ relative to heat energy above $2\mu$ and below 0.5 micron directs heat concurrently to the first and second structures to heat the first structure to a temperature sufficiently high and much higher then the second structure to permit a predetermined function to be performed in conjunction with the first structure while maintaining the second structure below a predetermined temperature. The function is then performed. The heat source preferably comprises an unfocused tungsten halogen lamp.

6 Claims, 1 Drawing Sheet

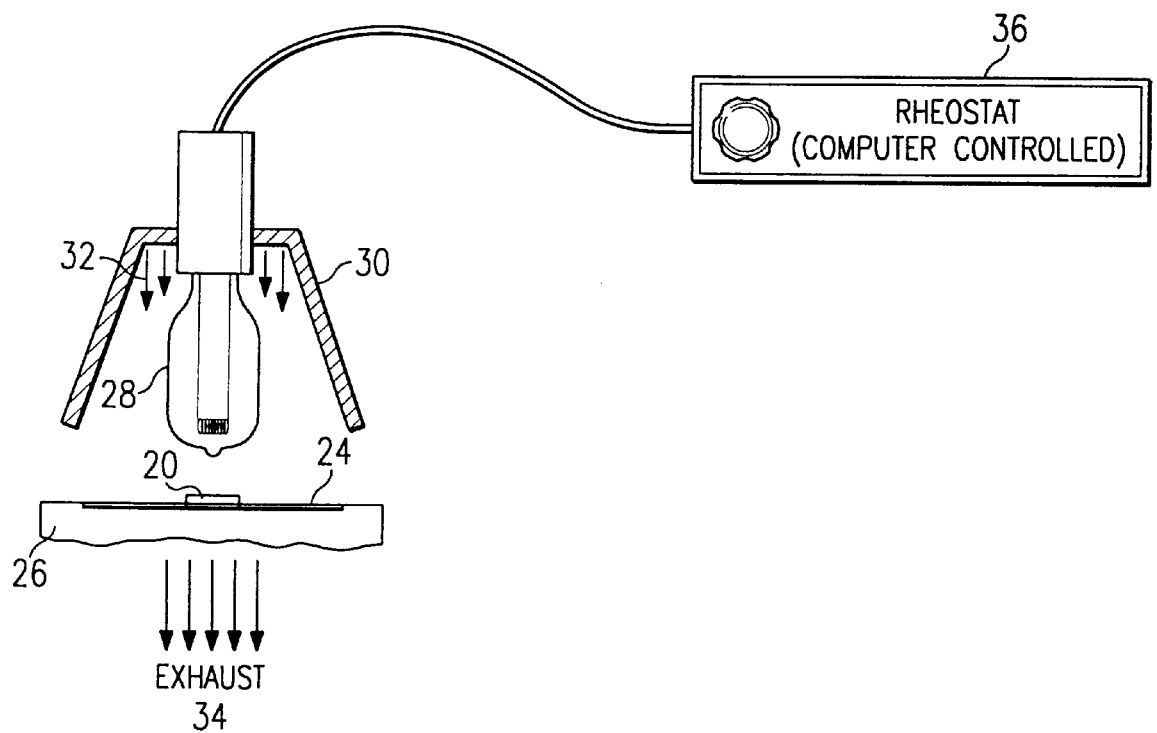

RAPID AND SELECTIVE HEATING METHOD IN INTEGRATED CIRCUIT PACKAGE ASSEMBLY BY MEANS OF TUNGSTEN HALOGEN LIGHT SOURCE

CROSS REFERENCE TO RELATED APPLICATIONS

This application is a continuation in part of Ser. No. 08/255,197, filed Jun. 7, 1994 and the applications and prior art cited therein which are all incorporated herein by reference. This application is also related to provisional application 60/033,402 filed Dec. 18, 1996.

BACKGROUND OF THE INVENTION

1. Field of the Invention

This invention relates to a system for rapidly heating selected portions of an integrated circuit package assembly and, more specifically, to such heating using a heat source capable of selectively heating a predetermined portion of an area while the entire area is being subjected to heat-generating radiations from the heat source, the heat source preferably being a tungsten halogen light source.

2. Brief Description of the Prior Art

In the fabrication of semiconductor devices and particularly integrated circuits, it is desirable that the semiconductor chip be heated to temperatures in the range of about 200 to 300° C. prior to wire bonding in order to improve the bonding process. It is also desirable that the lead frame to which a bond is to be made be retained at a much lower temperature than the chip, this lower temperature being sufficiently low to minimize oxidation of the lead frame material, generally copper. Lead frame oxidation generally diminishes the wet solderability thereof, leading to the obvious problems resulting therefrom. This problem has existed in the prior art because the mechanism used for heating of the semiconductor chip, generally a heater block or hot plate, also supports the lead frame and is non-heat selective. Accordingly, both the chip and the lead frame are heated together as a single unit to about the same high temperature, this being the temperature required for bonding to the chip. It is therefore apparent that a system whereby the semiconductor chip can be selectively heated relative to the lead frame while the chip and lead frame are in contact with each other is highly desirable.

SUMMARY OF THE INVENTION

In accordance with the present invention, the above described problems of the prior art are minimized and there is provided an apparatus and procedure for sending defocused or unfocused heat-inducing radiations over a general area wherein certain components within the area are selectively heated at a much greater rate than the remainder of the area. The use of unfocused heat-inducing radiations eliminates the need for the focussing equipment and permits the radiations to traverse a general area without requirement for accurate positioning since the nature of the materials receiving the radiations will determine the degree of heating thereof. For example, a semiconductor chip will heat up much more rapidly than will a copper-based lead frame prior to wire bonding, thereby permitting wire bonding between the chip and the lead frame without excessively heating up the lead frame. The same type of operation is available when the lead frame is replaced by a tape with conductors thereon for standard tape automated bonding (TAB) wherein it is best to heat up the metal lead portions on the tape adjacent the chip and the chip to the exclusion of the tape itself since the tape degrades at the normal wire bonding temperatures and affects the electrical properties of the tape. The tape can be between the chip and a circuit board.

It has been determined that certain materials, such as, for example, the chip, will heat up at a much greater rate than will other materials, such as, for example, the lead frame material, when the heat source is providing unfocused energy radiations in the range of from about $0.5\mu$ to about $2.0\mu$. This is because the lead frame material, generally copper, heats up rapidly when the heat energy radiations are above $2\mu$ but heats slowly when the heat energy is in the range of from about $0.5\mu$ to about $2\mu$ whereas the chip material, generally silicon, germanium or a group III-V or group II-VI compound, heats up rapidly when the heat energy is in the range of from about $0.5\mu$ to about $2\mu$. It follows that a heat source which supplies at least a substantial part of its heat energy in the range of from about $0.5\mu$ to about $2\mu$ will selectively heat the semiconductor material relative to the lead frame. The amount of the energy in the range of from about $0.5\mu$ to about $2\mu$ required will be dependent upon the heat temperature differential required as well as the rate at which this temperature differential is achieved. Accordingly, a heat source which provides a substantial portion of its heat energy in the range of from about $0.5\mu$ to about $2\mu$ is required in accordance with the present invention. The standard tungsten halogen light source generally provides a substantial portion of its heat energy in the range of from about $0.5\mu$ to about $2\mu$.

Briefly, the above is accomplished with regard to a lead frame and chip by providing a base and disposing both a lead frame and a chip thereon in standard relation to each other. A heat source of the type described above, preferably with a reflector to direct most of the radiations to a desired area, then directs the heat to the lead frame and chip. The chip will heat up to the required bonding temperature and bonding thereto then takes place while the lead frame meanwhile remains at a temperature lower than that of the chip and sufficiently low to avoid excessive oxidation thereof. The heat source is then turned off after bonding takes place.

BRIEF DESCRIPTION OF THE DRAWING

The FIGURE conceptually illustrates a heating system for a semiconductor die and associated lead frame in accordance with the present invention.

DESCRIPTION OF THE PREFERRED EMBODIMENT

The FIGURE is a drawing conceptually illustrating an inventive optical heating system and method for use in conjunction with bonding of a wire between a pad on a semiconductor chip and a lead frame. In the FIGURE, a silicon semiconductor die 20 rests on a chip pad 26 along with a lead frame 24. Examples of lead frame materials include copper alloy, alloy 42, palladium plated copper, and nickel plated copper. An optical heat source 28, a typical such source being described in the above noted application, can be used herein and that heat source is incorporated herein by reference. Optical heat source 28 generates substantial radiations in the 0.5 to 2 micron range, this energy being used to heat the lead frame 24 and the die 20. For copper based lead frames and normal die size, this heating system is particularly advantageous as the lead frame 24 remains much cooler than die 20 during die heating. As an example, a 1 minute exposure to optical heat source 28 may result in die 20 being heated to about 200° C. while lead frame 24 is heated to only about 125° C. As such, optical heat source 28 selectively heats die 20. Principal heat transfer occurs by radiation and the temperature response of the die is advantageously a smooth transient. Temperature profiles can be readily controlled during cure by varying the current through the lamp 28. In the prior art heater block method, however, heat transfer is through conduction which results in a step function like temperature response. Resident heat in the heater block precludes rapid cooling, thereby causing further oxidation of the lead frame material. Rapid optical heating allows rapid thermal response.

Optical heat source 28 is preferably a lamp of the type that emits near infrared light. Exemplary lamp examples include incandescent halogen lamps of the tungsten type and xenon type. Near infrared light wavelengths range from just about 0.5 microns to about 2.0 microns. Silicon chip 20 has good absorption in the near infrared spectrum. The energy of the tungsten halogen light, for example, is absorbed more by silicon chip 20 than by lead frame 24 which has a higher incidence of reflection than chip 20. The silicon chip 20 is heated by radiation to a higher temperature than lead frame 24 due to selective heating. Wire bonding then takes place while the chip is heated relative to the lead frame.

A reflector 30 helps direct unfocused emissions from lamp 28 toward lead frame 24. Preferably the emissions are directed over the width of the lead frame so that uniform heating occurs. The light is spread over the lead frame area as opposed to being focused on the semiconductor chip. Optionally, dry air 32 can flow over the die 20, through lead finger cutouts (unillustrated) in lead frame 24 through porous chip pad 26 and out exhaust outlet 34. Purge air 32 is able to flow over die 20 and through lead frame 24 more closely to the edge of die 20 substantially increasing the evacuation of outgassing effects and the like. The intensity (power) of lamp 28 may be controlled by a rheostat 36 or SCR which in turn may be computer controlled, the computer being optionally program controlled. This advantageously allows lamp power to be profiled or turned on and off with immediate energy response in contrast to the heater block of prior art which is effectively unprofileable during snap cure because of its thermal mass. Instant lamp power adjustment aids in energy profiling.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. An apparatus for selectively heating a semiconductor die more rapidly than an adjacent lead frame during a wire bonding procedure comprising:

(a) a semiconductor die disposed adjacent a lead frame;

(b) a heat source which provides a major portion of its heat energy in the range of from about $0.5\mu$ to about $2\mu$ relative to heat energy above $2\mu$ for directing said heat concurrently to said semiconductor die and said lead frame to heat said semiconductor die to a temperature sufficiently high for wire bonding while maintaining said lead frame in a substantially non-oxidizing state by causing said semiconductor die to initially heat up at a more rapid rate than said lead frame; and (c) a wire bonder for bonding a wire to said die while said die is at a required bonding temperature which is higher temperature than the temperature of said lead frame.

2. The apparatus of claim 1 wherein the heat source comprises an unfocused lamp.

3. The apparatus of claim 1 further comprising a rheostat coupled to said heat source to control the amount of heat generated by said heat source.

4. The apparatus of claim 2 further comprising a rheostat coupled to said unfocused heat source to control the amount of heat generated by said heat source.

5. The apparatus of claim 1 further comprising a computer coupled to said heat source to control current to said heat source.

6. The apparatus of claim 2 further comprising a computer coupled to said heat source to control current to said heat source.

* * * * *